(12) United States Patent
Gau et al.

(10) Patent No.: US 6,882,029 B1
(45) Date of Patent: Apr. 19, 2005

(54) JUNCTION VARACTOR WITH HIGH Q FACTOR AND WIDE TUNING RANGE

(75) Inventors: Jing-Horng Gau, Hsin-Chu Hsien (TW); Anchor Chen, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/707,221

(22) Filed: Nov. 27, 2003

(51) Int. Cl.[7] .................... H01L 29/93; H01L 27/108; H01L 29/76; H01L 29/94; H01L 31/119
(52) U.S. Cl. ............... 257/595; 257/312; 257/596; 257/597; 257/598; 257/599; 257/600
(58) Field of Search ................. 257/348, 350, 257/371, 391, 392, 393, 401, 402, 403, 312, 595–602

(56) References Cited

U.S. PATENT DOCUMENTS

| | | | | |
|---|---|---|---|---|
| 5,198,687 A | * | 3/1993 | Baliga | 257/137 |
| 6,392,277 B1 | * | 5/2002 | Mitani et al. | 257/347 |
| 6,528,849 B1 | * | 3/2003 | Khemka et al. | 257/342 |
| 6,576,958 B2 | * | 6/2003 | Ker et al. | 257/355 |
| 6,608,747 B1 | * | 8/2003 | Ito | 361/277 |
| 6,630,376 B1 | * | 10/2003 | Krishnan et al. | 438/199 |
| 6,635,518 B2 | * | 10/2003 | Aipperspach et al. | 438/151 |
| 6,642,607 B2 | * | 11/2003 | Ohnishi et al. | 257/595 |
| 6,646,305 B2 | * | 11/2003 | Assaderaghi et al. | 257/347 |
| 6,700,151 B2 | * | 3/2004 | Peng | 257/298 |
| 6,764,891 B2 | * | 7/2004 | Altmann | 438/200 |
| 2004/0026750 A1 | * | 2/2004 | Takamura | 257/391 |
| 2004/0082124 A1 | * | 4/2004 | Coolbaugh et al. | 438/237 |

* cited by examiner

Primary Examiner—Jerome Jackson
Assistant Examiner—Jesse A. Fenty
(74) Attorney, Agent, or Firm—Winston Hsu

(57) ABSTRACT

A PN-junction varactor includes a first ion well of first conductivity type formed on a semiconductor substrate of second conductivity type. A first dummy gate is formed over the first ion well. A first gate dielectric layer is formed between the first dummy gate and the first ion well. A second dummy gate is formed over the first ion well at one side of the first dummy gate. A second gate dielectric layer is formed between the second dummy gate and the first ion well. A first heavily doped region of the second conductivity type is located in the first ion well between the first dummy gate and the second dummy gate. The first heavily doped region of the second conductivity type serving as an anode of the PN-junction varactor. Second heavily doped regions of the first conductivity type located in the first ion well at one side of the first dummy gate that is opposite to the first heavily doped region and at one side of the second dummy gate that is opposite to the first heavily doped region, the second heavily doped regions being electrically connected to each other and serving as a cathode of the PN junction varactor.

11 Claims, 7 Drawing Sheets

US 6,882,029 B1

JUNCTION VARACTOR WITH HIGH Q FACTOR AND WIDE TUNING RANGE

BACKGROUND OF INVENTION

1. Field of the Invention he present invention relates generally to a varactor, and more particularly, to a PN-junction varactor having improved quality factor (Q factor) and extended tuning range.

2. Description of the Prior Art

A varactor is, essentially, a variable voltage capacitor. The capacitance of a varactor, when within its operating parameters, decreases as a voltage applied to the device increases. Such a device is useful in the design and construction of oscillator circuits now commonly used for, among other things, communications devices. Varactors are typically employed in voltage-controlled oscillators (VCOs) where a frequency of an oscillator is controlled by an applied current or voltage. In such instances, the VCOs are used when a variable frequency is required, or when a signal needs to be synchronized to a reference signal.

Numerous varactors have been developed and are employed in integrated circuit technologies, for example, PN-diodes, Schottky diodes or MOS-diodes as a varactor in bipolar, CMOS and BiCMOS technologies. Among these, two varactor structures are most frequently used: the PN-junction varactor and the MOS varactor. Currently the PN-junction varactor is predominantly used in LC oscillators. Both these structures can be implemented using standard CMOS processes.

Referring to FIG. 1, a prior art PN diode varactor is illustrated in a cross-sectional view. As shown in FIG. 1, a substrate 10 includes an N-well 12, and a plurality of isolation structures 14, such as field oxide layer or shallow trench isolation (STI), on surfaces of the N-well 12 and the substrate 10. The isolation structures 14 define a plurality of predetermined regions on the N-well 12 to form at least an N-type doping region 16 and a P-type doping region 18, thus completing a diode structure having a PN junction. When the diode is reverse-biased, a depletion region occurs in the PNjunction of the diode and acts as a dielectric, so that the N-type doping region 16 and the P-type doping region 18 separated by the dielectric form an equivalent capacitor. With an adjustment in the voltage across the anode (the P-type doping region 18) and the cathode (the N-type doping region 16) of the diode, a width of the depletion region varies to change the equivalent capacitance of the varactor.

Referring to FIG. 2, a prior art MOS varactor is illustrated in a cross-sectional view. The prior art MOS varactor is formed on an N-well 22. The prior art MOS varactor includes a polysilicon gate structure 26 serving as an anode of the MOS varactor, a gate oxide layer 28 between the gate structure 26 and the N-well 22, and two $N^+$ doped regions 24 on both sides of the gate structure 26, wherein the $N^+$ doped regions 24, which are implanted in the N-well 22, serve as a cathode of the MOS varactor. N type lightly doped drain regions 25 are also provided.

The main drawback of the prior art PN junction varactor as set forth in FIG. 1 is a low maximum to minimum capacitance ratio and small quality factor (Q factor). The MOS varactor does not suffer on this account, with a high maximum to minimum capacitance ratio of roughly four to one for a typical 0.25 $\mu$m CMOS process. Furthermore, the MOS varactor's ratio increases in deep submicron processes due to the thinner gate oxide used. However, the MOS varactor's transition from maximum to minimum capacitance is abrupt. This gives a MOS varactor a small, highly non-linear voltage control range.

SUMMARY OF INVENTION

It is therefore a primary object of the claimed invention to provide a varactor to improve the electrical performance thereof.

It is another object of the claimed invention to provide a junction varactor having improved quality factor and extended tuning range, and a CMOS-compatible method for fabricating the same.

According to the claimed invention, a PN-junction varactor includes a first N-well formed on a semiconductor substrate; a first gate situated over the first N-well; a first gate dielectric layer provided between the first gate and the first N-well; a second gate situated at one side of the first gate and overlying the first N-well; a second gate dielectric layer provided between the second gate and the first N-well; a $P^+$ doping region located in the first N-well between the first gate and the second gate, and serving as an anode of the PN-junction varactor; a first $N^+$ doping region located at one side of the first gate that is opposite to the $P^+$ doping region within the first N-well; and a second $N^+$ doping region located at one side of the second gate that is opposite to the $P^+$ doping region within the first N-well. The second $N^+$ doping region is electrically coupled to the first $N^+$ doping region for serving as a cathode of the PN-junction varactor. The $P^+$ doping region is encompassed by a second N-well, and wherein the second N-well has a doping concentration that is higher than that of the first N-well.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
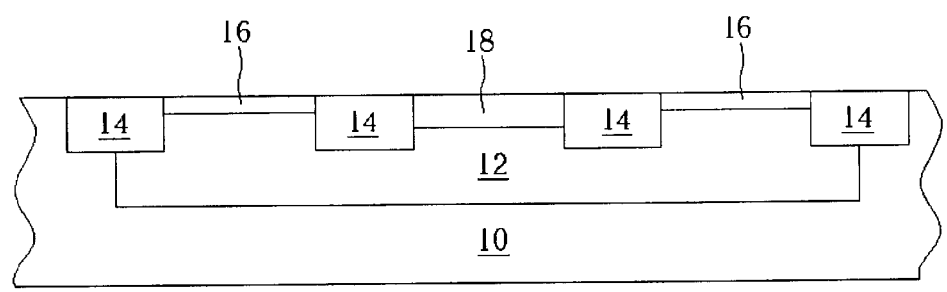
FIG. 1 is a cross-sectional schematic diagram illustrating a prior art PN junction varactor.
Figure 2:
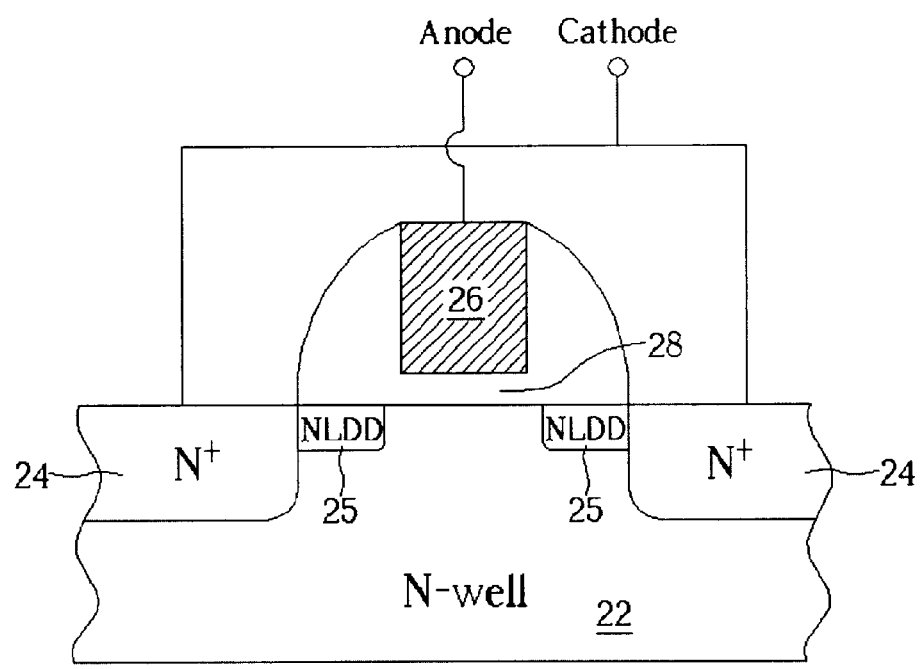
FIG. 2 is a cross-sectional schematic diagram illustrating a prior art MOS varactor.

The present invention, which provides novel junction varactors for CMOS and BiCMOS technologies as well as a method for fabricating the same, will now be described in more detail by referring to the drawings that accompany the present application. It is to be understood that the conductivity types, device or circuit layout, or materials used as set forth in the following detailed description and figures are only for illustration purpose. The scope of this invention should be construed as limited only by the metes and bounds of the appended claims.

Figure 3:
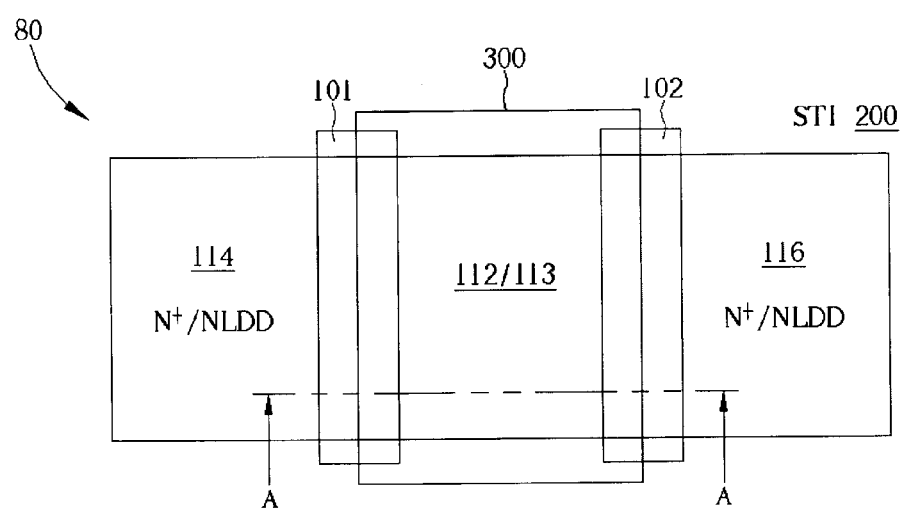
FIG. 3 is a schematic top view showing the layout of a junction varactor 80 in accordance with one preferred embodiment of the present invention, wherein the position of an extra $P^+/N^+$ implant mask opening is also shown.
Figure 4:
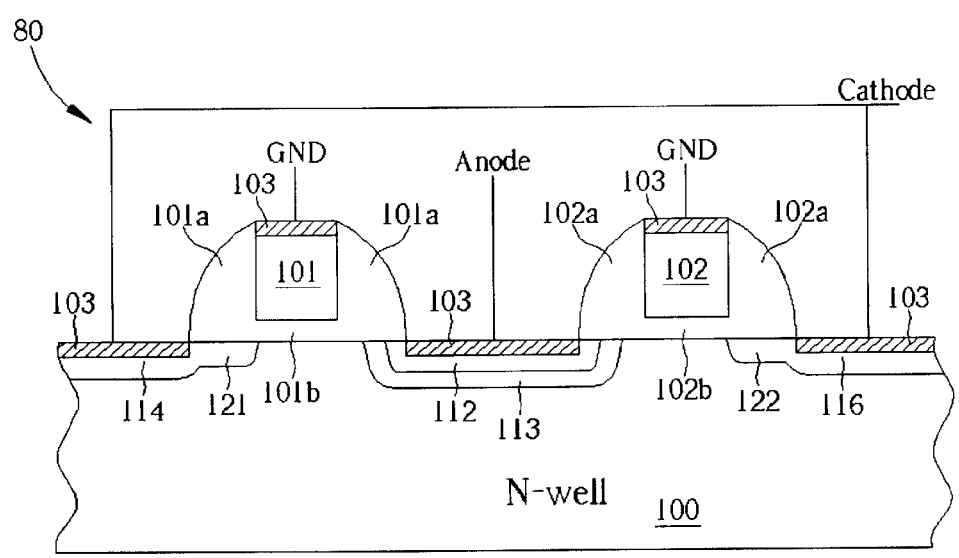
FIG. 4 is a schematic cross-sectional diagram showing the junction varactor 80 along line AA of FIG. 3.

Referring initially to FIG. 3 and FIG. 4, wherein FIG. 3 is a schematic top view showing the basic layout of a junction varactor 80 in accordance with one preferred embodiment of the present invention, FIG. 4 is a schematic cross-sectional diagram showing the junction varactor 80 along line AA of FIG. 3. According to the preferred embodiment of the present invention, the junction varactor 80 is formed on an N-well 100, which may be formed on a commercially available P type silicon substrate or a silicon-on-insulator (SOI) substrate (not shown). The N-well 100 is electrically isolated by shallow trench isolation (STI) 200. In a case that the substrate is an SOI substrate, the STI 200 reaches down to a buried oxide layer and thus renders the N-well 100 in a floating status. The junction varactor 80 further comprises a dummy polysilicon gate 101 lying across the N-well 100, and a dummy polysilicon gate 102 situated at one side of the dummy polysilicon gate 101. As specifically indicated in FIG. 3, the dummy polysilicon gate 102, which overlies the N-well 100, is arranged substantially in parallel with the dummy polysilicon gate 101. Both of the dummy polysilicon gate 101 and dummy polysilicon gate 102 have vertical sidewalls, on which spacers 101a and 102a are formed. A gate dielectric layer 101b and a gate dielectric layer 102b are provided under the dummy polysilicon gates 101 and 102, respectively. A $P^+$ doping region 112, which serves as an anode of the junction varactor 80 and is encompassed by an N-well 113, is formed in the N-well 100 between the dummy polysilicon gates 101 and 102. The N-well 113 has a doing concentration that is higher than that of the N-well 100. As specifically indicated in FIG. 3, the formation of the N-well 113 may be accomplished by using an extra photo mask with a mask opening 300 above the area to be ion implanted. The ion implantation may be carried out in tilt angle manner. It is one of the primary features of the present invention that the additional N-well 113 that encompasses the $P^+$ doping region 112 enhances the quality factor (Q factor) of the junction varactor 80 and extends tuning range thereof.

As best seen in FIG. 4, in the N-well 100, at one side of the dummy polysilicon gate 101 that is opposite to the $P^+$ doping region 112, an $N^+$ doping region 114 is provided. An N type lightly doped drain (NLDD) 121 that is merged with the $N^+$ doping region 114 extends laterally to the gate 101. In the N-well 100, at one side of the dummy polysilicon gate 102 that is opposite to the $P^+$ doping region 112, an $N^+$ doping region 116 is provided. Likewise, an NLDD 122 that is merged with the $N^+$ doping region 116 extends laterally to the gate 102. The $N^+$ doping region 114 is electrically coupled to the $N^+$ doping region 116 by interconnection, and serves as a cathode of the junction varactor 80. Furthermore, to reduce sheet resistance of the varactor 80, a salicide layer 103 is provided on the exposed surface of the $P^+$ doping region 112, the $N^+$ doping region 114, and the $N^+$ doping region 116. Compared with the prior art junction varactor, the present invention junction varactor has a lower resistance because there is no STI formed between the anode and cathode of the varactor. Therefore, the present invention junction varactor has a higher Q factor and better performance. In operation, the dummy polysilicon gates 101 and 102 are preferably grounded (GND) in order to eliminate interference. By altering the bias between the anode and cathode of the junction varactor 80, the capacitance of the junction varactor may be tuned in an extended tuning range.

Figure 5:
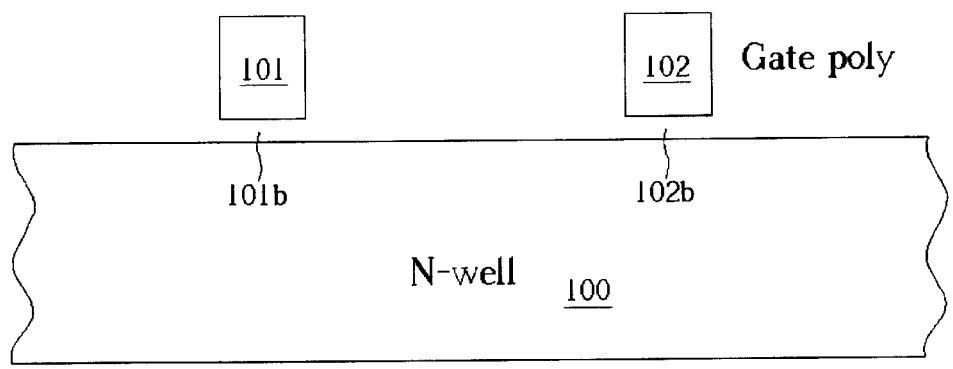
FIGS. 5–7 are schematic cross-sectional diagrams showing the method for making the junction varactor as set forth in FIG. 4 according to this invention.
Figure 6:
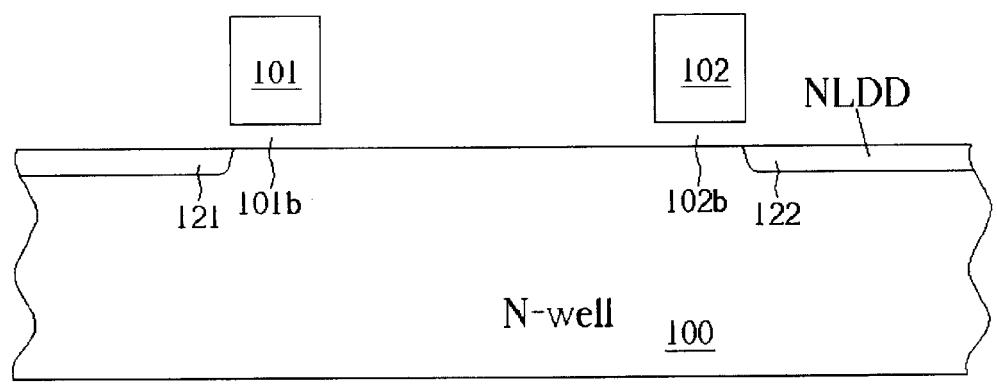
Figure 7:
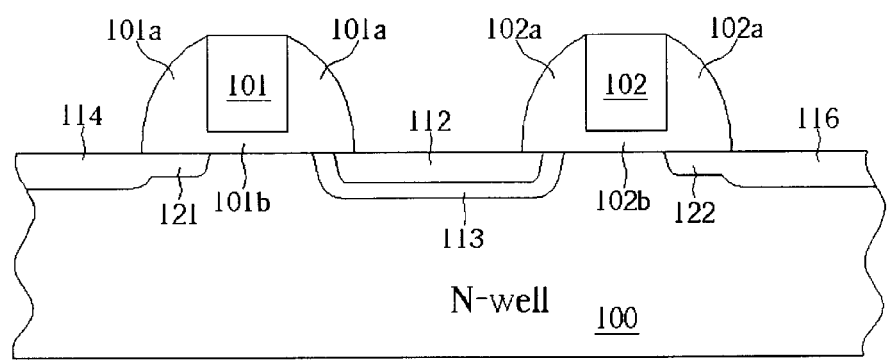

Reference is now made to the embodiment illustrated in FIGS. 5–7 wherein the various processing steps employed in fabricating the inventive junction varactor are shown. The method for fabricating the inventive junction varactor in accordance with the preferred embodiment of this invention is CMOS compatible. FIG. 5 illustrates the first step used in forming the inventive junction varactor. As shown in FIG. 5, a substrate (not explicitly shown) is provided, on which an N-well 100 is formed by any method known in the art for example ion implantation. The N-well 100 is isolated by STI. Subsequently, an insulation layer (not explicitly shown) such as thermally grown gate oxide layer is formed on the surface of the N-well 100. A layer of polysilicon is deposited over the insulation layer, and then patterned to form gate structures 101 and 102 using conventional lithographic and dry etching processes. The deposition of the polysilicon layer may be fulfilled by conventional LPCVD.

As shown in FIG. 6, using a suitable mask or an NLDD implant photo to mask the area between the gate 101 and the gate 102, an NLDD ion implantation process is carried out to dope ions such as arsenic into the N-well 100 at one side of the gate 101 and at one side of the gate 102, thereby forming an NLDD region 121 and NLDD region 122.

As shown in FIG. 7, spacers 101a and 102a are formed on sidewalls of the gates 101 and 102, respectively. Thereafter, using a suitable mask or $N^+$ implant photo to mask the area between the gate 101 and the gate 102, an $N^+$ ion implantation process is carried out to dope a high dosage of ions such as arsenic into the N-well 100 at one side of the gate 101 and at one side of the gate 102, thereby forming $N^+$ region 114 and $N^+$ region 116. Finally, using the mask shown in FIG. 3 to expose the area between the gate 101 and the gate 102, a $P^+$ ion implantation and a subsequent $N^+$ ion implantation are carried to form the $P^+$ doping region 112 and the N-well 113 that encompasses the $P^+$ doping region 112. To form the N-well 113 that encompasses the $P^+$ doping region 112, a tilt angle ion implantation may be used. After implementing a conventional self-align silicidation process, the junction varactor 80 as set forth in FIG. 4 is produced.

Those skilled in the art will readily observe that numerous modifications and alterations of the present invention may be made while retaining the teachings of the invention. Accordingly, the above disclosure should be construed as limited only by the metes and bounds of the appended

What is claimed is:

1. A PN-junction varactor, comprising:
   a first N-well formed on a semiconductor substrate;
   a first gate situated over said first N-well;
   a first gate dielectric layer provided between said first gate and said first N-well;
   a second gate situated at one side of said first gate and overlying said first N-well;
   a second gate dielectric layer provided between said second gate and said first N-well;
   a $P^+$ doping region located in said first N-well between said first gate and said second gate, and serving as an anode of said PN-junction varactor, wherein said $P^{30}$ doping region is encompassed by a second N-well, and wherein said second N-well has a doping concentration that is higher than that of said first N-well;
   a first $N^+$ doping region located at one side of said first gate that is opposite to said $P^+$ doping region within said first N-well; and a second N⁺ doping region located at one side of said second gate that is opposite to said P⁺ doping region within said first N-well, and said second N⁺ doping region being electrically coupled to said first N⁺ doping region for serving as a cathode of said PN-junction varactor.

2. The PN-junction varactor according to claim 1 further comprising a first N type lightly doped drain (NLDD) region merged with said first N⁺ doing region and wherein said first NLDD region extends to said first gate.

3. The PN-junction varactor according to claim 1 further comprising a second NLDD region merged with said second N⁺ doing region and wherein said second NLDD region extends to said second gate.

4. The PN-junction varactor according to claim 1 wherein spacers are provided on sidewalls of said first gate and second gate.

5. The PN-junction varactor according to claim 1 wherein a salicide layer is formed on said first gate, said second gate, said first N⁺ doing region, said second N⁺ doing region, and said P⁺ doping region.

6. The PN-junction varactor according to claim 1 wherein, in operation, said first gate and said second gate are grounded.

7. A PN-junction varactor, comprising:
   a first ion well of first conductivity type formed on a semiconductor substrate of second conductivity type;
   a first dummy gate formed over said first ion well;
   a first gate dielectric layer between said first dummy gate and said first ion wel;
   a second dummy gate formed over said first ion well at one side of said first dummy gate;
   a second gate dielectric layer between said second dummy gate and said first ion well;
   a first heavily doped region of said second conductivity type located in said first ion well between said first dummy gate and said second dummy gate, said first heavily doped region of said second conductivity type serving as an anode of said PN-junction varactor, wherein said fit heavily doped region is encompassed by a second ion well of said first conductivity type, and wherein said second ion well has a doping concentration that is higher than that of said first ion well; and
   second heavily doped regions of said first conductivity type located in said first ion well at one side of said first dummy gate that is opposite to said first heavily doped region and at one side of said second dummy gate that is opposite to said first heavily doped region, said second heavily doped regions being electrically connected to each other and serving as a cathode of said PN junction varactor.

8. The PN-junction varactor according to claim 7 wherein said first conductivity type is N type, and said second conductivity type is P type.

9. The PN-junction varactor according to claim 7 wherein, in operation, said first dummy gate and said second dummy gate are grounded.

10. The PN-junction varactor according to claim 7 further comprising a lightly doped drain (LDD) formed in said first ion well, and wherein said LDD is merged with said second heavily doped regions and laterally extends to said first/second dummy gates.

11. The PN-junction varactor according to claim 7 wherein spacers are provided on sidewalls of said first dummy gate and second dummy gate.

* * * * *